United States Patent
Fuh et al.

(10) Patent No.: US 12,176,304 B2
(45) Date of Patent: *Dec. 24, 2024

(54) DEVICES AND METHODS RELATED TO VOLTAGE COMPENSATED SWITCH STACK

(71) Applicant: SKYWORKS SOLUTIONS, INC., Irvine, CA (US)

(72) Inventors: Hanching Fuh, Allston, MA (US); Anuj Madan, Somerville, MA (US); Guillaume Alexandre Blin, Carlisle, MA (US); Fikret Altunkilic, North Andover, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/502,806

(22) Filed: Nov. 6, 2023

(65) Prior Publication Data
US 2024/0153891 A1    May 9, 2024

Related U.S. Application Data

(63) Continuation of application No. 17/706,583, filed on Mar. 28, 2022, now Pat. No. 11,810,874, which is a (Continued)

(51) Int. Cl.
*H04B 1/00* (2006.01)
*H01L 23/64* (2006.01)
(Continued)

(52) U.S. Cl.
CPC ......... *H01L 23/642* (2013.01); *H03K 17/693* (2013.01); *H04W 88/02* (2013.01); *H01L 27/0629* (2013.01); *H01L 2924/0002* (2013.01)

(58) Field of Classification Search
CPC .............. H01L 23/642; H01L 27/0629; H01L 2924/0002; H01L 2924/00; H03K 17/693; H04W 88/02
See application file for complete search history.

(56) References Cited

U.S. PATENT DOCUMENTS

| | | | |
|---|---|---|---|
| 2002/0036345 A1* | 3/2002 | Iseki | H01L 21/563 257/734 |
| 2003/0063427 A1* | 4/2003 | Kunihiro | H03H 7/38 257/E23.062 |

(Continued)

FOREIGN PATENT DOCUMENTS

| | | |
|---|---|---|
| CN | 102291108 | 12/2011 |
| JP | 2013-102508 | 5/2013 |

OTHER PUBLICATIONS 201580060317.7, Voltage Compensated Switch Stack, May 5, 2017.
(Continued)

*Primary Examiner* — Xin Jia
(74) *Attorney, Agent, or Firm* — Chang & Hale LLP

(57) ABSTRACT

A radio frequency (RF) switch arrangement that improves the voltage handling capacity of a stack of switching elements (e.g., field-effect transistors (FETs)). The RF switch arrangement can include a ground plane and a stack arranged in relation to the ground plane, the stack including a plurality of switching elements coupled in series with one another. The RF switch arrangement can also include a plurality of capacitive elements, each of the plurality of capacitive elements providing a capacitive path across respective terminals of a corresponding one of the plurality of switching elements.

16 Claims, 12 Drawing Sheets

Related U.S. Application Data continuation of application No. 16/035,692, filed on Jul. 15, 2018, now Pat. No. 11,289,432, which is a continuation of application No. 14/824,583, filed on Aug. 12, 2015, now Pat. No. 10,032,731.

(60) Provisional application No. 62/047,163, filed on Sep. 8, 2014.

(51) Int. Cl.
  H03K 17/693 (2006.01)
  H04W 88/02 (2009.01)
  H01L 27/06 (2006.01)

(56) References Cited

U.S. PATENT DOCUMENTS

| | | | |
|---|---|---|---|
| 2006/0114051 A1 | 6/2006 | Yasuda et al. | |
| 2009/0073078 A1* | 3/2009 | Ahn | H03K 17/102 343/876 |
| 2011/0025403 A1 | 2/2011 | Cassia | |
| 2011/0044016 A1 | 2/2011 | Takagi | |
| 2011/0165759 A1* | 7/2011 | Englekirk | H03K 17/6871 257/E21.327 |
| 2011/0214912 A1* | 9/2011 | Lin | H05K 1/0251 174/262 |
| 2012/0001056 A1* | 1/2012 | Fife | G01N 27/4143 250/214 P |
| 2012/0268205 A1 | 10/2012 | Presti | |
| 2013/0009725 A1 | 1/2013 | Heaney et al. | |
| 2014/0266415 A1* | 9/2014 | Kerr | H03K 17/693 327/552 |

OTHER PUBLICATIONS 17112903.2, Voltage Compensated Switch Stack, Dec. 6, 2017.
10-2017-7009486, Voltage Compensated Switch Stack, Apr. 7, 2017.
PCT/US15/47951, Voltage Compensated Switch Stack, Sep. 1, 2015.
104129553, Voltage Compensated Switch Stack, Sep. 7, 2015.
International Search Report and Written Opinion for PCT/US2015/047951 dated Dec. 15, 2015.

* cited by examiner

| NAME | ADDITIONAL CDS (0.6mm DEVICE) | DESCRIPTION |
|---|---|---|
| c1 | 134.4fF | MAX M1 WIDTH, MAX MT WIDTH |
| c1b | 116.5fF | 3/4 MAX M1 WIDTH (1/4 NOMINAL M1 WIDTH), MAX MT WIDTH |
| c2 | 99.7fF | 1/2 MAX M1 WIDTH (1/2 NOMINAL M1 WIDTH), MAX MT WIDTH |
| c2b | 78.8fF | 1/4 MAX M1 WIDTH (3/4 NOMINAL M1 WIDTH), MAX MT WIDTH |
| c3 | 65.3fF | NOMINAL M1 WIDTH, MAX MT WIDTH |
| c3b | 55.2fF | NOMINAL M1 WIDTH, 1/2 MAX MT WIDTH (1/2 NOMINAL MT WIDTH) |
| c4 | 44.2fF | NOMINAL M1 WIDTH, NOMINAL MT WIDTH |
| c4b | 31.2fF | NOMINAL M1 WIDTH, NOMINAL MT WIDTH (3/4 LENGTH) |
| c5 | 20.8fF | NOMINAL M1 WIDTH, NOMINAL MT WIDTH (1/2 LENGTH) |
| c5b | 12.6fF | NOMINAL M1 WIDTH, NOMINAL MT WIDTH (1/4 LENGTH) |

FIG.8

DEVICES AND METHODS RELATED TO VOLTAGE COMPENSATED SWITCH STACK

CROSS-REFERENCE TO RELATED APPLICATION(S)

This application is a continuation of U.S. patent application Ser. No. 17/706,583, filed Mar. 28, 2022, entitled "DEVICES AND METHODS RELATED TO VOLTAGE COMPENSATED SWITCH STACK," which is a continuation of U.S. patent application Ser. No. 16/035,692, filed Jul. 15, 2018, entitled "VOLTAGE COMPENSATED SWITCH STACK," now U.S. Pat. No. 11,289,432, issued Mar. 29, 2022, which is a continuation of U.S. patent application Ser. No. 14/824,583, filed Aug. 12, 2015, entitled "VOLTAGE COMPENSATED SWITCH STACK," now U.S. Pat. No. 10,032,731, issued Jul. 24, 2018, which claims priority to U.S. Provisional Application No. 62/047,163, filed Sep. 8, 2014, entitled "VOLTAGE COMPENSATED SWITCH STACK," the disclosure of each of which is hereby expressly incorporated by reference herein in its entirety.

BACKGROUND

Field

The present disclosure generally relates to the field of electronics, and more particularly, to radio frequency switches.

Description of Related Art

In antenna tuning and other radio frequency (RF) switching applications, a plurality of switching elements (e.g., often field-effect transistors (FETs)) are used as passive components. The plurality of switching elements are coupled in series to form a stack. The stack configuration enables a number of functions, including voltage and power handling capacity. For example, a FET stack is often utilized to allow an RF switch to bear high power under mismatch conditions. It is desirable for a FET stack in an off state to handle relatively high voltage swings by evenly distributing applied voltage across the FETs (i.e., switches) in the stack. However, each FET in a stack often has a different parasitic loading to the substrate than the other FETs in the stack, which causes uneven drain-to-source swings to develop. Consequently, the top several FETs of a stack are forced to bear a disproportionate percentage of the total voltage swing, and are thus more likely to be a point of failure for the stack.

SUMMARY

The various implementations described herein include devices, arrangements and methods that increase the voltage handling capacity of a stack of switching elements (e.g., field-effect transistors (FETs)). Numerous details are described herein in order to provide a thorough understanding of the example implementations illustrated in the accompanying drawings. The invention may be practiced without many of the specific details described herein. Moreover, well-known methods, components, and circuits have not been described in exhaustive detail so as not to unnecessarily obscure more pertinent aspects of the implementations described herein.

For example, one implementation includes a radio frequency (RF) switch arrangement including a ground plane and a stack arranged in relation to the ground plane, the stack including a plurality of switching elements coupled in series with one another. The RF switch arrangement further includes a plurality of capacitive elements, each of the plurality of capacitive elements providing a capacitive path across respective terminals of a corresponding one of the plurality of switching elements. As noted above, a stack includes a plurality of switching elements coupled in series with one another. Each switching element includes respective terminals.

In some implementations, the plurality of switching elements includes field effect transistors, wherein at least some of the field effect transistors are each coupled source-to-drain with one or more adjacent field effect transistors.

In some implementations, the plurality of switching elements includes at least one of field effect transistors, bipolar junction transistors, GaAs transistors, diodes, and microelectromechanical devices.

In some implementations, wherein the ground plane comprises at least a portion of a semiconductor substrate.

In some implementations, the plurality of capacitive elements provide monotonically increasing or decreasing capacitance values across the stack.

In some implementations, at least some of the plurality of capacitive elements are formed with an excess of vias and metal available in a semiconductor manufacturing process.

In some implementations, each of at least some of the plurality of capacitive elements provide a respective lateral capacitance between a drain and a source of a corresponding field effect transistor utilized as switching element.

In some implementations, the present disclosure relates to a radio frequency (RF) switch module that includes a packaging substrate configured to receive a plurality of components. The RF switch module also includes a ground plane arranged on a first side of the packaging substrate and a stack arranged in relation to the ground plane on a second side of the packaging substrate, the stack including a plurality of switching elements coupled in series with one another. The RF switch module further includes a plurality of capacitive elements, each of the plurality of capacitive elements providing a capacitive path across respective terminals of a corresponding one of the plurality of switching elements.

In some implementations, the plurality of switching elements includes field effect transistors, wherein at least some of the field effect transistors are each coupled source-to-drain with one or more adjacent field effect transistors.

In some implementations, the plurality of switching elements includes at least one of field effect transistors, bipolar junction transistors, GaAs transistors, diodes, and microelectromechanical devices.

In some implementations, the ground plane comprises at least a portion of a semiconductor substrate.

In some implementations, the plurality of capacitive elements provide monotonically increasing or decreasing capacitance values across the stack.

In some implementations, at least some of the plurality of capacitive elements are formed with an excess of vias and metal available in a semiconductor manufacturing process.

In some implementations, each of at least some of the plurality of capacitive elements provide a respective lateral capacitance between a drain and a source of a corresponding field effect transistor utilized as switching element.

According to some teachings, the present disclosure relates to a radio frequency (RF) device that includes a ground plane and a stack arranged in relation to the ground plane, the stack including a plurality of switching elements coupled in series with one another. The RF device also includes a plurality of capacitive elements, each of the plurality of capacitive elements providing a capacitive path across respective terminals of a corresponding one of the plurality of switching elements. The RF device further includes an antenna coupled to a transceiver through the stack, the antenna configured to facilitate transmission or reception of a radio frequency signal.

In some implementations, the RF device includes a wireless device.

In some implementations, the wireless device includes at least one of a base station, a repeater, a cellular phone, a smartphone, a computer, a laptop, a tablet computer, and peripheral device.

In some implementations, the plurality of switching elements includes field effect transistors, wherein at least some of the field effect transistors are each coupled source-to-drain with one or more adjacent field effect transistors.

In some implementations, the plurality of switching elements includes at least one of field effect transistors, bipolar junction transistors, GaAs transistors, diodes, and microelectromechanical devices.

In some implementations, the ground plane comprises at least a portion of a semiconductor substrate.

In some implementations, the plurality of capacitive elements provide monotonically increasing or decreasing capacitance values across the stack.

In some implementations, at least some of the plurality of capacitive elements are formed with an excess of vias and metal available in a semiconductor manufacturing process.

In some implementations, each of at least some of the plurality of capacitive elements provide a respective lateral capacitance between a drain and a source of a corresponding field effect transistor utilized as switching element.

In some implementations, the present disclosure relates to a method of managing parasitic capacitance of a radio frequency switch arrangement. The method can include producing a nominal switch stack layout having at least one switch that can be arranged in a stack having a nominal amount of parasitic capacitance allowed using a particular semiconductor manufacturing process. The method can also include adding parasitic capacitive elements across one or more of the switches in the stack and setting values of the capacitive elements such that capacitive elements provide monotonically increasing or decreasing capacitance values across the stack.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 8 is a table summarizing the characteristics of the various implementations for which performance data is shown in FIG. 7.

Figure 1:
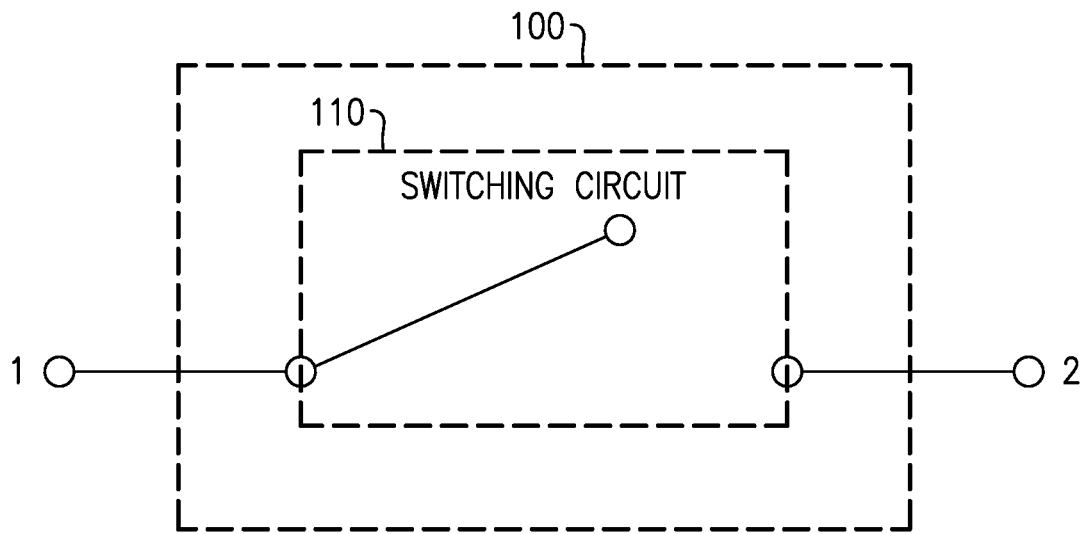
FIG. 1 is a schematic diagram of a radio frequency (RF) switch according to some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION OF SOME IMPLEMENTATIONS

The headings provided herein, if any, are for convenience only and do not necessarily affect the scope or meaning of the claimed invention.

In antenna tuning and other radio frequency (RF) switching applications, a plurality of switching elements (e.g., often field-effect transistors (FETs)) are used as passive components. The plurality of switching elements are coupled in series to form a stack.

In some implementations, the voltage handling capability of a FET stack in an "off" state is a function of the number of FETs included in the stack. Typically, the voltage handling capacity of the stack increases as the number of FETs in the stack increases. However, simply increasing the number of FETs in a stack can have drawbacks. For example, the parasitic capacitance ($C_{off}$) of a stack is the capacitance of the stack when all of the FETs in the stack are each in an off state. Each FET in a stack contributes to the parasitic capacitance ($C_{off}$) that the stack inadvertently couples to the surrounding components. As such, each additional FET typically increases the parasitic capacitance ($C_{off}$) of the stack.

In many RF applications, there is a desire to manage the parasitic capacitance ($C_{off}$) of the stack because of the drawbacks associated with the parasitic capacitance ($C_{off}$). For example, the parasitic capacitance ($C_{off}$) can adversely affect tuning and impedance matching. Tight tolerances for the parasitic capacitance ($C_{off}$) are often particularly important to downstream manufacturers that precisely tune and/or impedance-match antenna elements to other components through stack-based switches. Additionally, the resistance of the stack in the "on" state (Ron) is typically inversely related to the parasitic capacitance ($C_{off}$). As such, lowering the parasitic capacitance ($C_{off}$) typically increases the resistance (Ron).

FIG. 1 is a schematic diagram of an implementation of an RF switch 100 according to some implementations. While certain specific features are illustrated, those skilled in the art will appreciate from the present disclosure that various other features have not been illustrated for the sake of brevity and so as not to obscure more pertinent aspects of the example implementations disclosed herein. To that end, the RF switch 100 includes a first port and a second port connected to a switching circuit 110. In some implementations, the RF switch 100 may be implemented on a semiconductor substrate. In the semiconductor substrate context, the switching circuit 110 includes a plurality of switching elements (e.g., FETs) shown in FIG. 2 collectively as stack 200.

In some implementations, the plurality of switching elements included in the stack 200 includes at least one of FETs, bipolar junction transistors (BJTs), GaAs transistors, diodes, and micro-electromechanical (MEMS) devices. In some implementations, a FET includes, for example, metal-oxide-semiconductor FETs (MOSFETs) such as silicon-on-insulator (SOI) MOSFETs. Those of ordinary skill in the art will also appreciate that FETs as described herein can be implemented in other process technologies, including but not limited to high-electron-mobility transistor (HEMT), SOI, silicon-on-sapphire (SOS), and complimentary metal-oxide-semiconductor (CMOS) technologies. Additionally and/or alternatively, those of ordinary skill in the art will appreciate that other transistors types, such as BJTs and heterojunction bipolar transistors (HBTs), are operable with or as an alternative to FETs in a number of circumstances.

Figure 2:
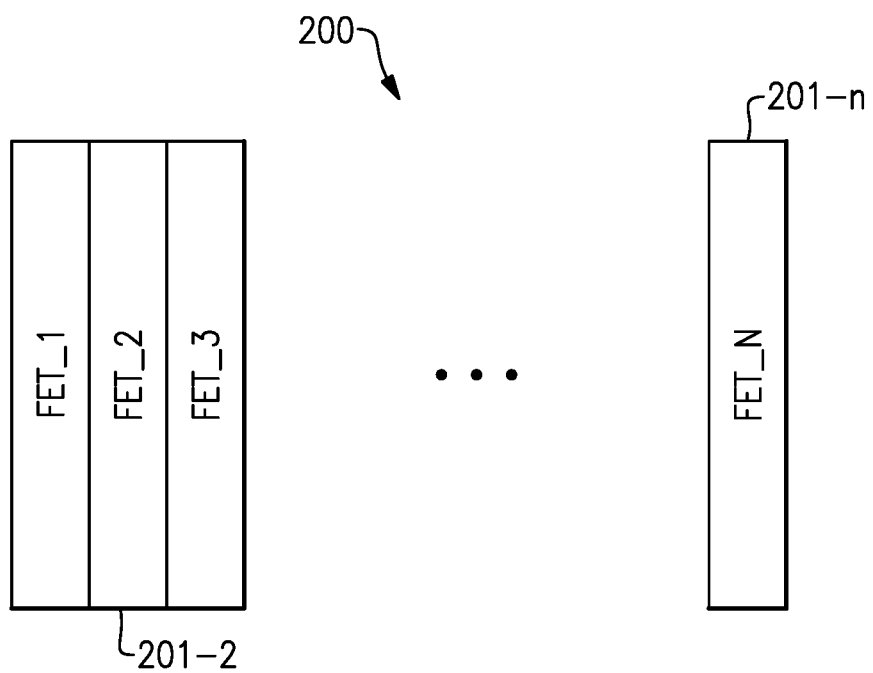
FIG. 2 is a schematic diagram of a stack of field-effect transistors (FETs) according to some implementations.

FIG. 2 is a schematic diagram of a stack 200 of FETs suitable for the RF switch 100 in FIG. 1 according to some implementations. According to some implementations, a FET has a source, a drain, a body node or a gate node. Additional FETs may be connected in series so as to define an RF signal path between an input end and an output end. Generally, the stack 200 includes N FETs (e.g., "FET_2" indicated by 201-2, and "FET_N" indicated by 201-*n*) arranged in series, such that adjacent FETs are coupled source-to-drain. As described below in more detail with reference to FIG. 3, for the purpose of describing various implementations, the stack 200 is arranged so that one or more fingers of an individual FET extend along a transverse axis of the stack, so that the transistor gates are parallel to the primary current path through the stack 200.

In some implementations, the FET stack 200 is capable of being in a first or second state, such that when in a first state, for example an ON state, an RF signal can be transmitted from the input end to the output end, allowing the RF switch 100 to transmit an RF signal from an input port to an output port. Meanwhile, when the FETs are in a second state, for example an OFF state, the FETs may prevent transmission of RF signals between the input end and the output end, thereby electrically isolating the input port from the output port of the RF switch 100.

Moreover, merely for the purpose of brevity and convenience, each FET (e.g., 201-2 and 201-*n*) or switching element in the stack 200 has substantially the same dimensions. However, those of ordinary skill in the art will appreciate that in various implementations some or all of the switching elements have varying dimensions with respect to one another, and that the terms variable-dimension and variable-geometry are used interchangeably herein. Variable-dimension/variable-geometry include, for example, different sizes, different shapes, different configurations, or some combination thereof, of one or more parts associated with the switching elements. In some implementations, one or more parts associated with the switching elements include parts that are inherent to the switching elements. In such implementations, one can see that advantageous features provided by such variable-dimensions of the inherent part(s) of the switching elements can be beneficial, since additional external components are not necessarily needed.

Figure 3:
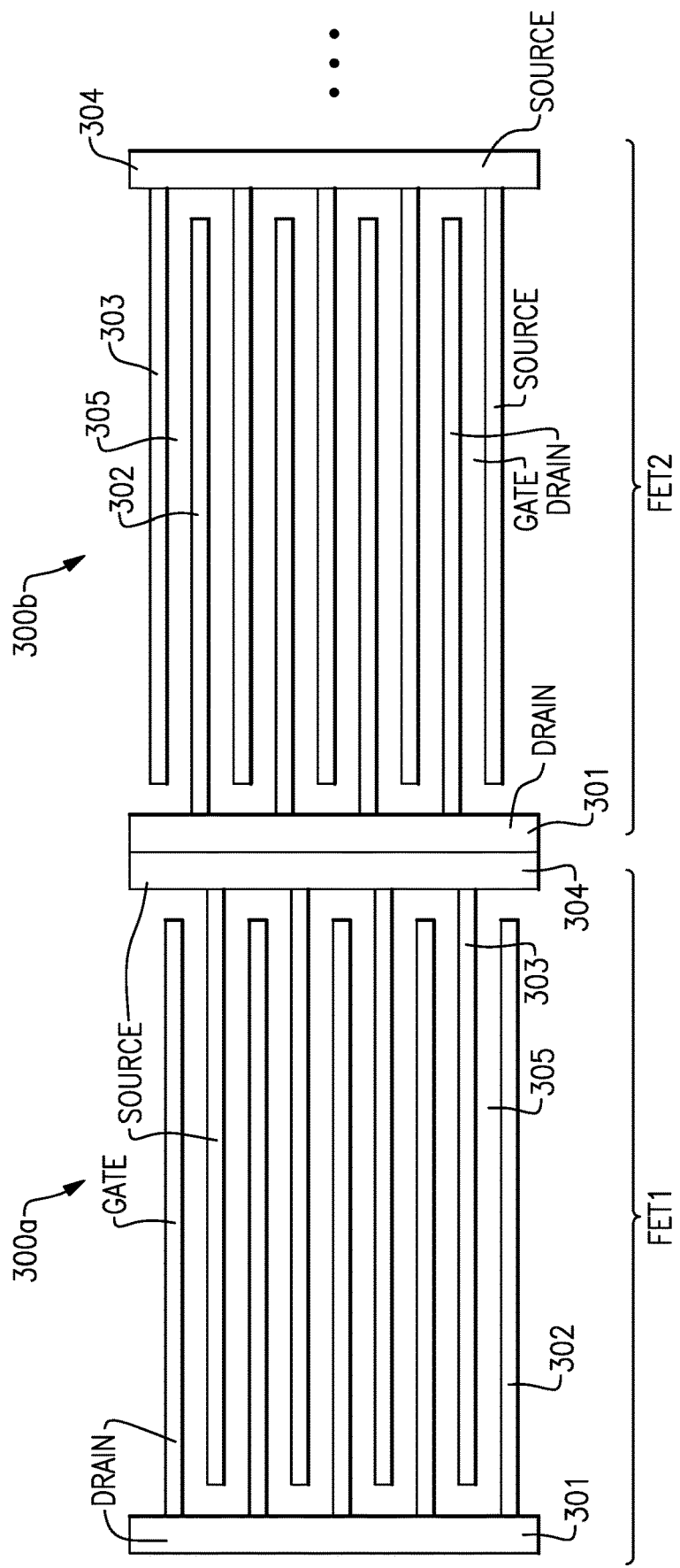
FIG. 3 is a schematic diagram of an example stacked-series arrangement of two FETs according to some implementations.

FIG. 3 is a schematic diagram of an example stacked-series arrangement of two FETs 300*a*, 300*b* according to some implementations. While only two FETs are illustrated in FIG. 3 as a non-limiting example, those of ordinary skill in the art will appreciate that a stacked-series arrangement of FETs includes two or more FETs, and that in some implementations one or more aspects described herein are included in an implementation of a single FET or switching device. Moreover, while certain specific features are illustrated, those skilled in the art will appreciate from the present disclosure that various other features have not been illustrated for the sake of brevity and so as not to obscure more pertinent aspects of the example implementations disclosed herein.

To that end, the FETs 300*a*, 300*b* each have a finger configuration and are arranged is series with respect to one another. In some implementations, a first metal feature 304 on the right side of each FET is provided as a source contact, and a second metal feature 301 on the left side is provided as a drain contact. Those of ordinary skill in the art will appreciate that a FET can be typically operated in reverse, such that second metal feature 301 functions as a source contact, and the first metal feature 304 functions as a drain contact. In some implementations, the drain contact 301 is arranged to function as an output (e.g., an RF output) of the FETs 300*a*, 300*b* arranged in series. As such, the source contact 304 of the FET 300*a* is coupled to the drain contact 301 of the FET 300*b*. Similarly, the source 304 contact of the FET 300*b* can be electrically connected to a drain contact of another FET, etc.

According to some implementations, a first plurality of finger features 303 are electrically connected to the respective source contact 304, and a second plurality of finger features 302 are electrically connected to the drain contact 301. The first and second pluralities of finger features 303, 302 are arranged in an interleaved configuration with respect to each other. Accordingly, as is generally understood, a respective gate feature 305 can be provided in each of the corresponding spaces between the interleaved finger features 303, 302 associated with the source contacts 304 and drain contacts 301, respectively.

Figure 4A:
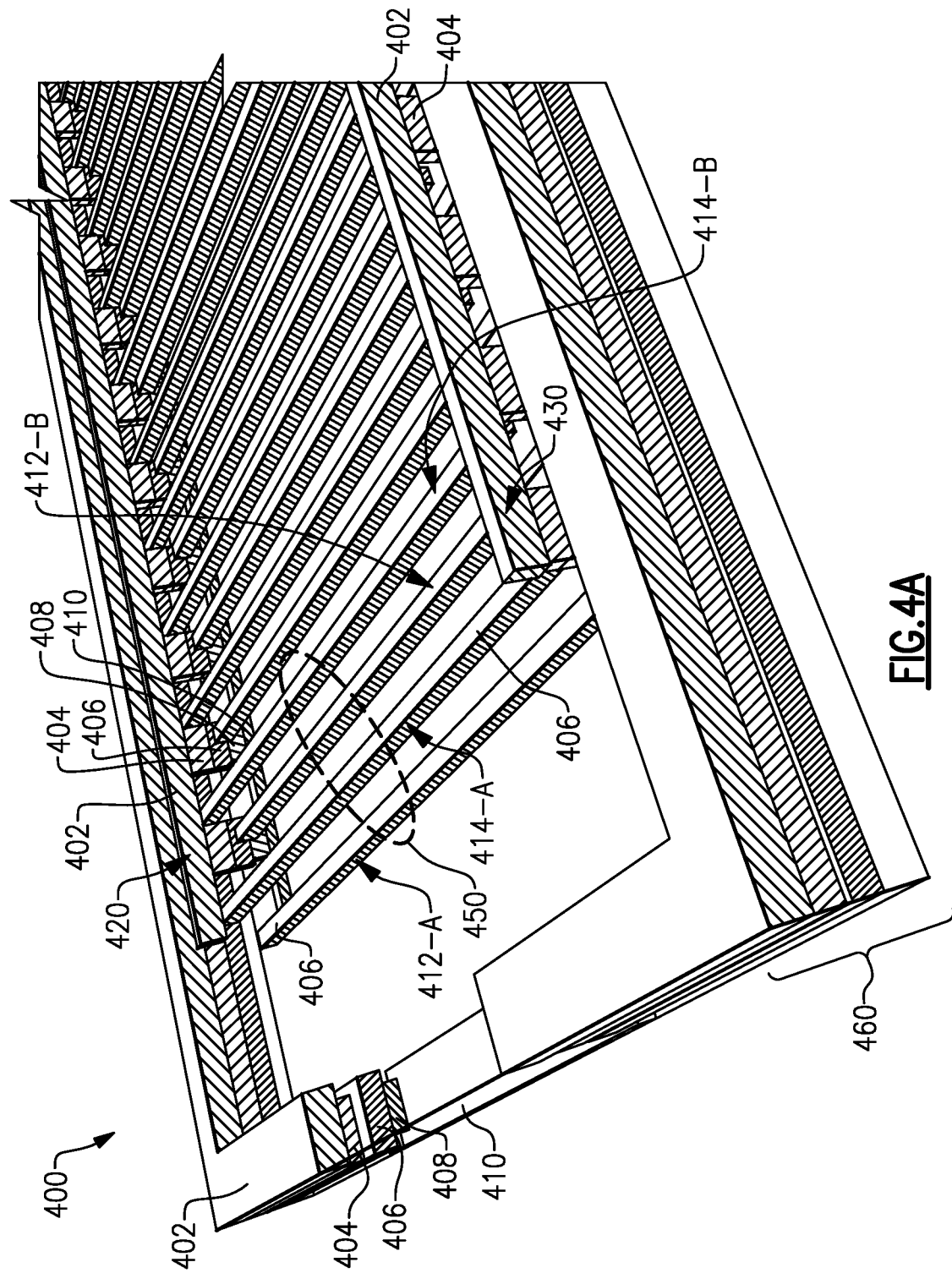
FIG. 4A is a perspective view of a first RF switch arrangement according to some implementations.
Figure 4B:
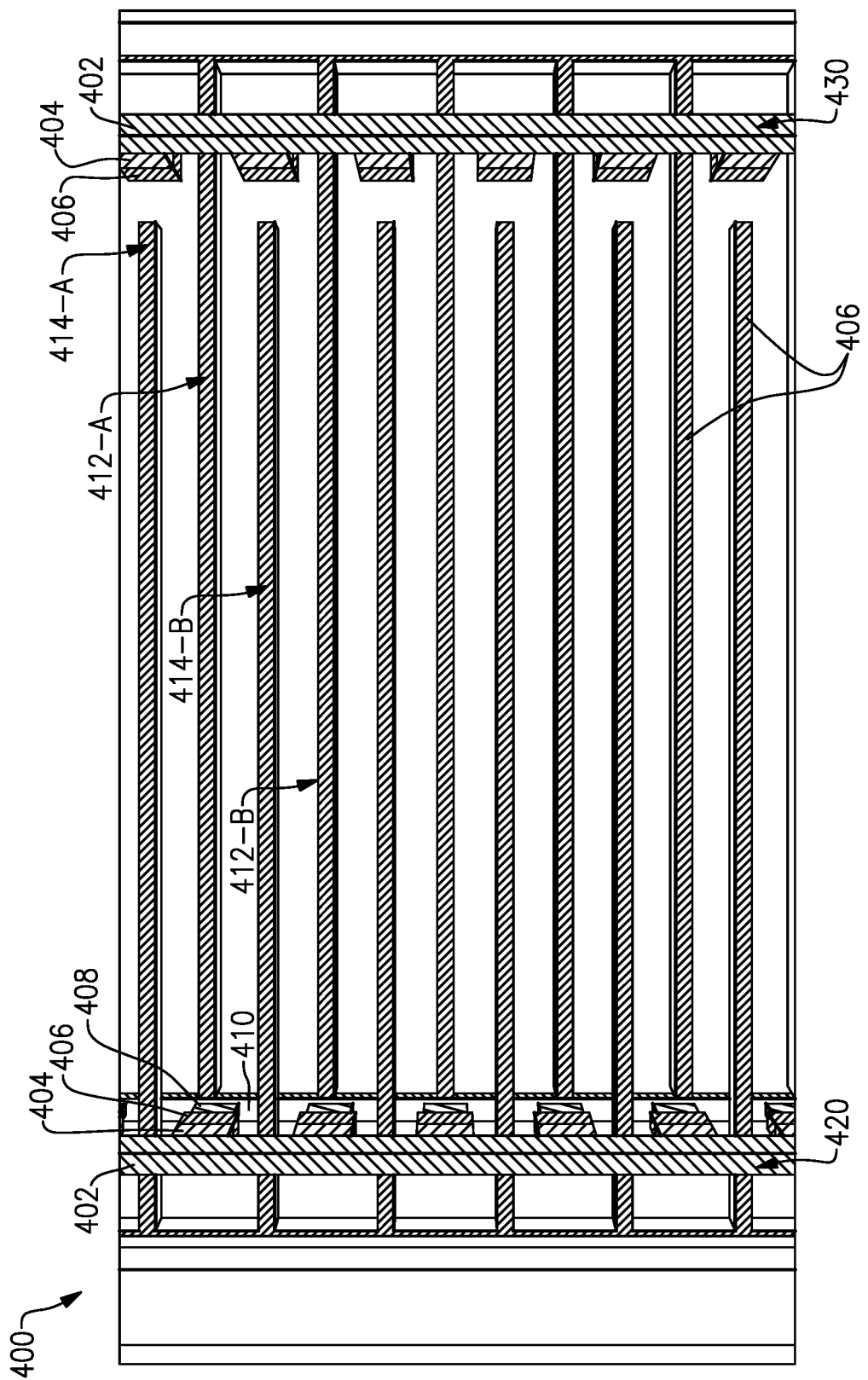
FIG. 4B is a plan view of the first RF switch arrangement in FIG. 4A.

FIG. 4A is a perspective view of a first RF switch arrangement 400 according to some implementations. FIG. 4B is a plan view of the first RF switch arrangement 400 in FIG. 4A. While certain specific features are illustrated, those skilled in the art will appreciate from the present disclosure that various other features have not been illustrated for the sake of brevity and so as not to obscure more pertinent aspects of the example implementations disclosed herein. To that end, the RF switch arrangement 400 includes a FET stack as described above with reference to FIGS. 2-3.

According to some implementations, the RF switch arrangement 400 includes: a plurality of drain finger features 412-A, 412-B, . . . ; a plurality of source finger features 414-A, 414-B, . . . ; a gate feature 420; and a body feature 430. In some implementations, at least some of the aforementioned features are at least partially enclosed by a frame feature 460. In some implementations, at least some of the aforementioned features are comprised of the following layers: metal layer$_1$ 402; via 404; metal layer$_2$ 406; contact 408; and polysilicon 410. As shown in FIGS. 4A-4B, the plurality of drain finger features 412 and the plurality of source finger features 414 are comprised of metal layer$_2$ 406.

Figure 6A:
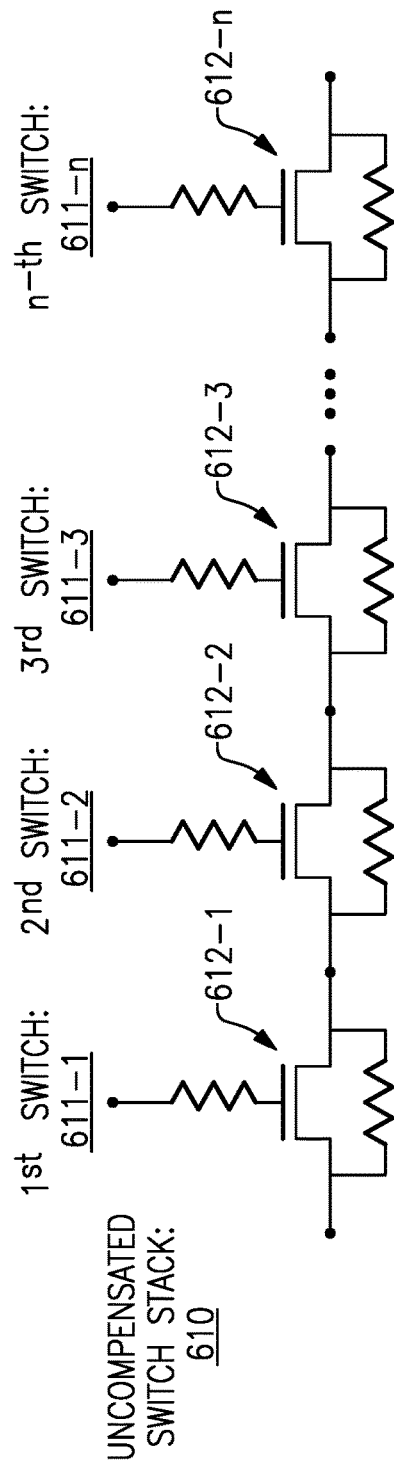
FIG. 6A is a schematic diagram of an uncompensated switch stack according to some implementations.

According to some implementations, a number of vias are provided within an area 450. In some implementations, the number of vias is provided such that the density of vias provides a nominal level of drain-to-source capacitance ($C_{DS}$). In some implementations, the nominal level of drain-to-source capacitance ($C_{DS}$) is the minimum that can be produced using a particular manufacturing process. In other words, the RF switch arrangement 400 of FIGS. 4A-4B is an example of an uncompensated switch stack. FIG. 6A is a schematic diagram of an uncompensated switch stack 610 according to some implementations. The uncompensated switch stack 610 includes n switches 611-1, 611-2, . . . , 611-*n*. The n switches 611-1, 611-2, . . . , 611-*n* each include a respective one of the FETs 612-1, 612-2, 612-*n* coupled in series drain-to-source with the FETs of adjacent switches.

Figure 5A:
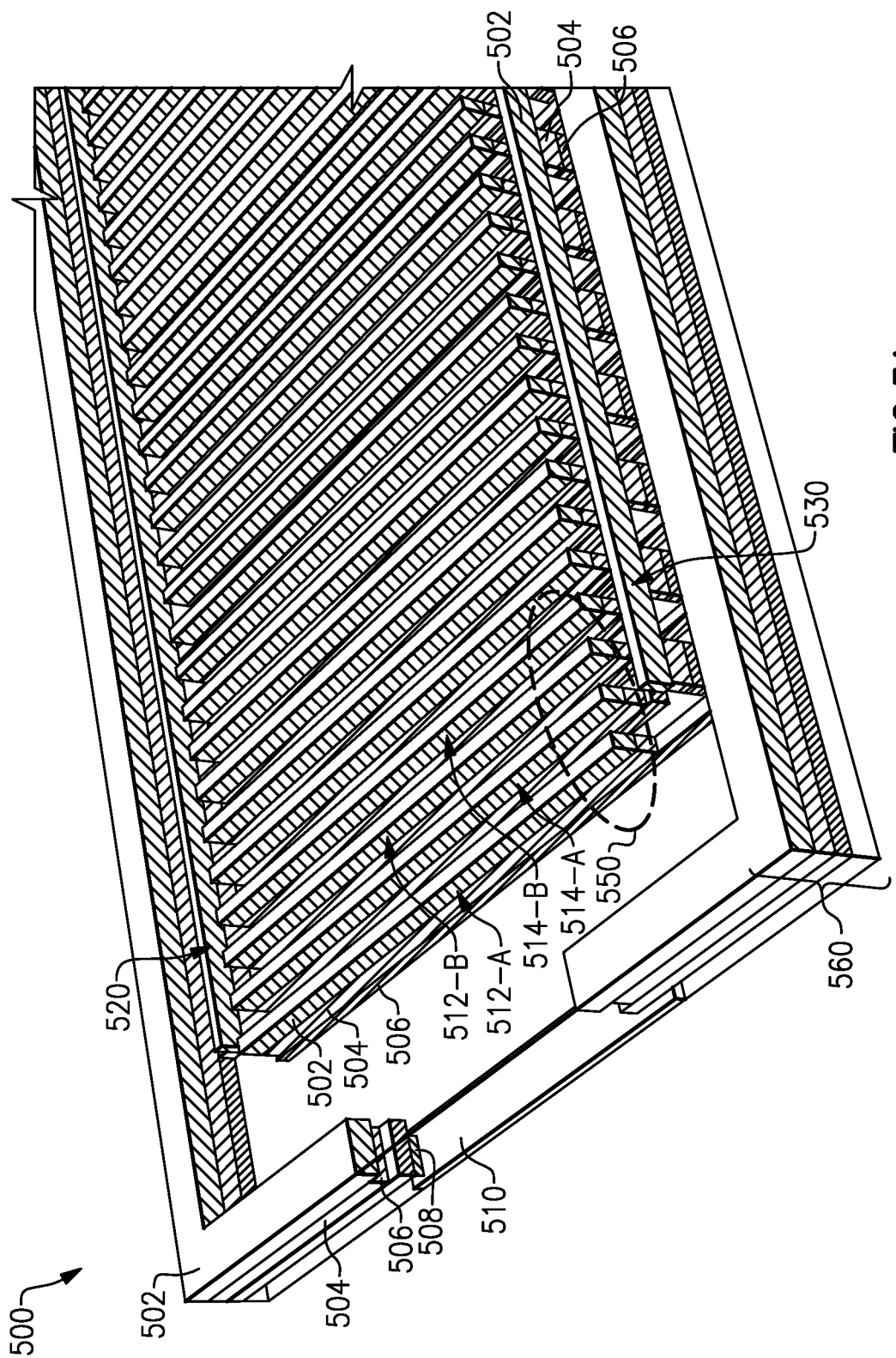
FIG. 5A is a perspective view of a second RF switch arrangement according to some implementations.
Figure 5B:
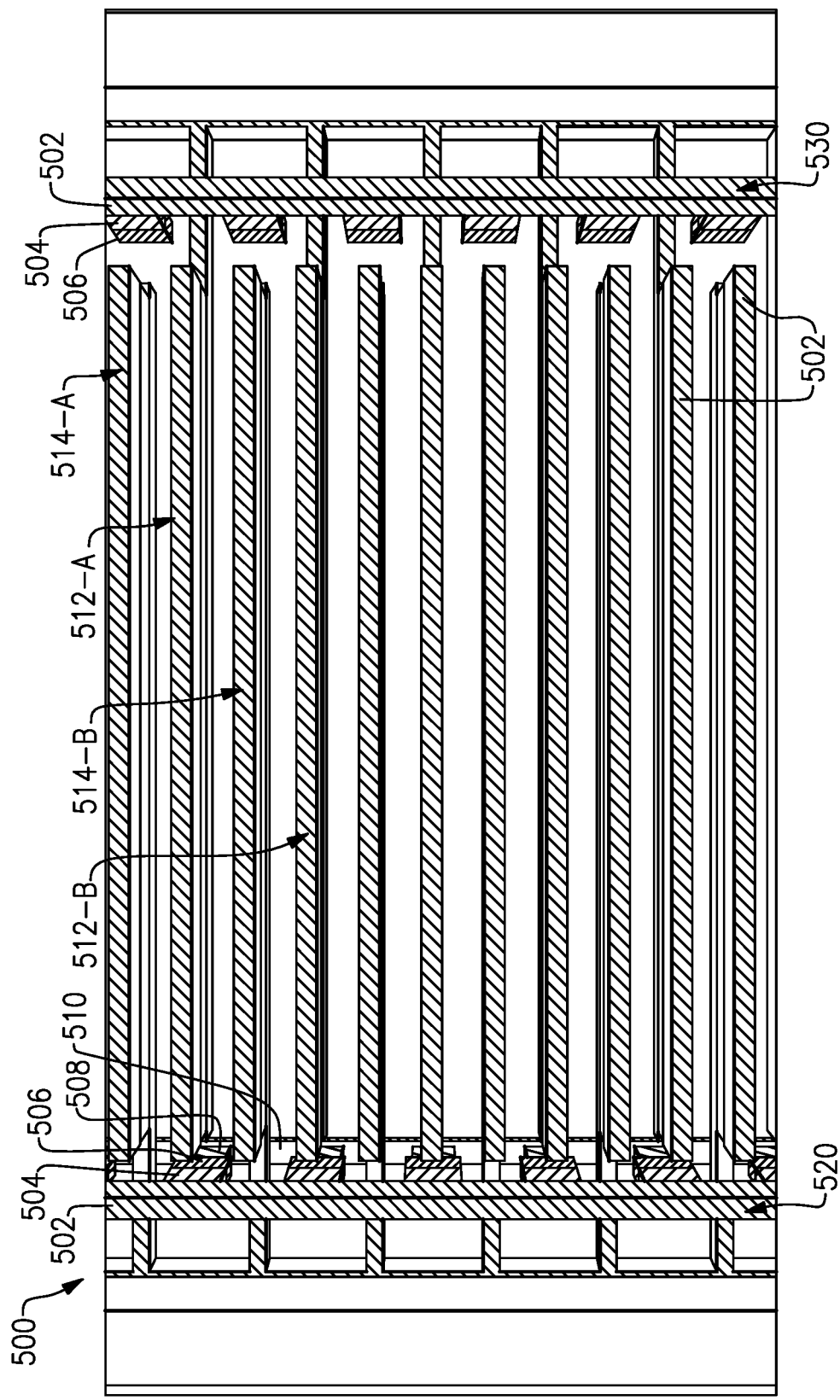
FIG. 5B is a plan view of the second RF switch arrangement in FIG. 5A.

FIG. 5A is a perspective view of a second RF switch arrangement 500 according to some implementations, which includes aspects that enable increased voltage handling. FIG. 5B is a plan view of the second RF switch arrangement 500 in FIG. 5A. While certain specific features are illustrated, those skilled in the art will appreciate from the present disclosure that various other features have not been illustrated for the sake of brevity and so as not to obscure more pertinent aspects of the example implementations disclosed herein. To that end, the RF switch arrangement 500 illustrated in FIGS. 5A-5B is similar to and adapted from the RF switch arrangement 400 illustrated in FIGS. 4A-4B, but the RF switch arrangement 500 is an example of a compensated switch stack in accordance with some implementations (shown schematically in FIG. 6B).

According to some implementations, the RF switch arrangement 500 includes: a plurality of drain finger features 512-A, 512-B, . . . ; a plurality of source finger features 514-A, 514-B, . . . ; a gate feature 520; and a body feature 530. In some implementations, at least some of the aforementioned features are at least partially enclosed by a frame feature 560. In some implementations, at least some of the aforementioned features are comprised of the following layers: metal layer$_1$ 502; via 504; metal layer$_2$ 506; contact 508; and polysilicon 510. As shown in FIGS. 5A-5B, the plurality of drain finger features 512 and the plurality of source finger features 514 are comprised of: metal layer$_1$ 502; via 504; and metal layer$_2$ 506.

As such, in some implementations, the RF switch arrangement 500 additionally includes FETS that each have a greater density of vias and metal in a given area 550, as compared to the given area 450 of the RF switch arrangement 400 illustrated in FIGS. 4A-4B. The added capacitance provided by the vias and/or excess metal creates a lateral capacitance between the drain and source of each FET in the stack. In other words, the excess vias/metal generates excess controllable, parasitic capacitance across a FET, which removes the need to layout an explicit capacitive element to achieve voltage compensation. In other words, the RF switch arrangement 500 of FIGS. 5A-5B is an example of a compensated (e.g., voltage compensated) switch stack.

Figure 6B:
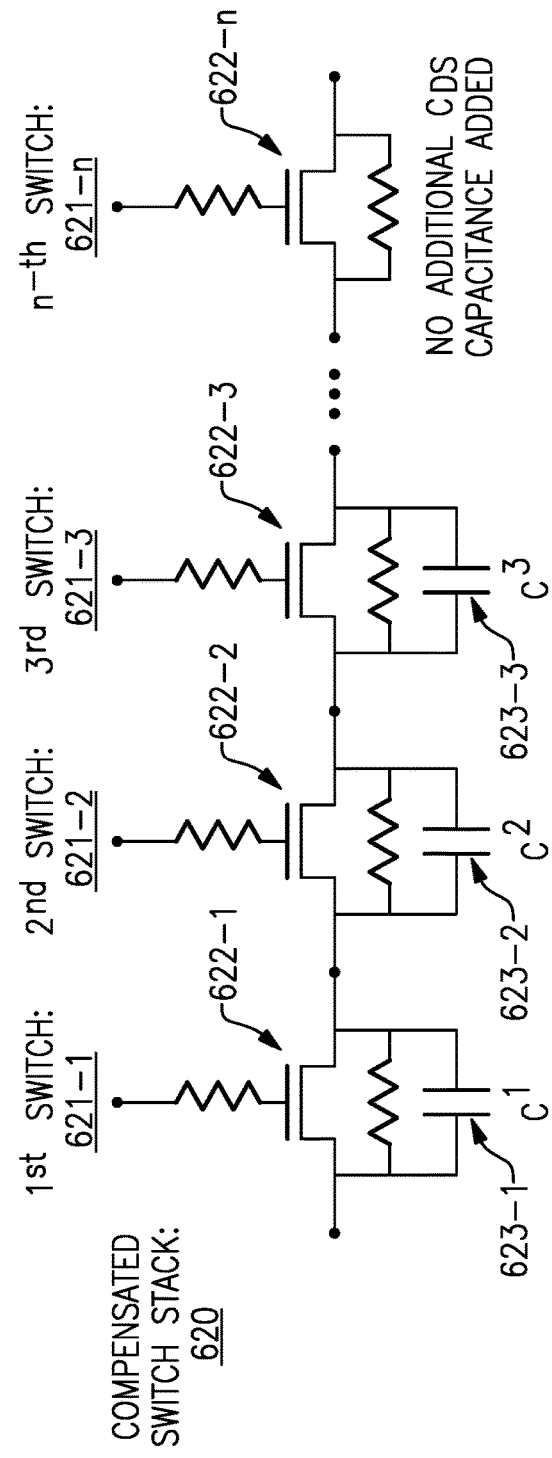
FIG. 6B is a schematic diagram of a compensated switch stack according to some implementations.

FIG. 6B is a schematic diagram of a compensated switch stack 620 according to some implementations. The compensated switch stack 620 illustrated in FIG. 6B is similar to and adapted from the uncompensated switch stack 610 illustrated in FIG. 6A. As such, similarly, the compensated switch stack 620 includes n switches 621-1, 621-2, . . . , 621-*n*. The n switches 621-1, 621-2, . . . , 621-*n* each include a respective one of the FETs 622-1, 622-2, . . . , 622-*n* coupled in series drain-to-source with the FETs of adjacent switches. Additionally, however, the compensated switch stack 620 includes a plurality of capacitive elements, each of the plurality of capacitive elements providing a capacitive path across respective terminals of a corresponding one of the plurality of switching elements. More specifically, in some implementations, there are no more than n−1 capacitive elements 623-1, 623-2, 623-3, . . . , 623-*m* (m≤n−1), and the plurality of capacitive elements provide monotonically increasing or decreasing capacitance values across the stack. Consequently, in some implementations, the FET at one end of the stack does not have an associated capacitive element. In some implementations, at least some of the plurality of capacitive elements are formed with an excess of vias and metal available in a semiconductor manufacturing process. In some implementations, each of at least some of the plurality of capacitive elements provide a respective lateral capacitance between a drain and a source of a corresponding field effect transistor utilized as switching element.

Figure 7:
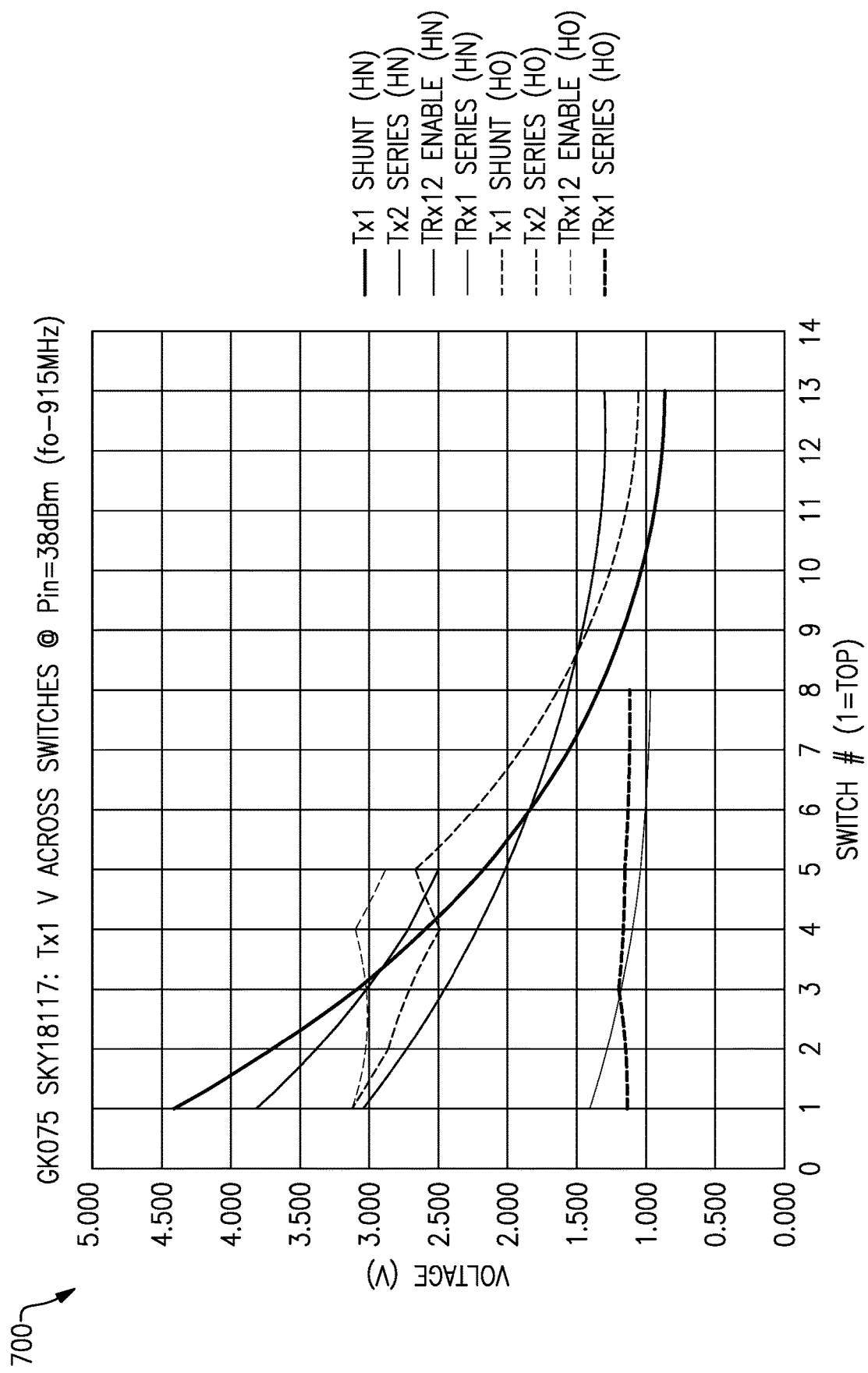
FIG. 7 is a performance showing the voltage handling capability of various implementations.

FIG. 7 is a performance diagram 700 showing the voltage handling capability of various implementations, and demonstrating that the additional capacitance provided by the use of excess vias and/or metal improves voltage handling in various switch arrangements. FIG. 8 is a table 800 summarizing the characteristics of the various implementations for which performance data is shown in FIG. 7.

Figure 9:
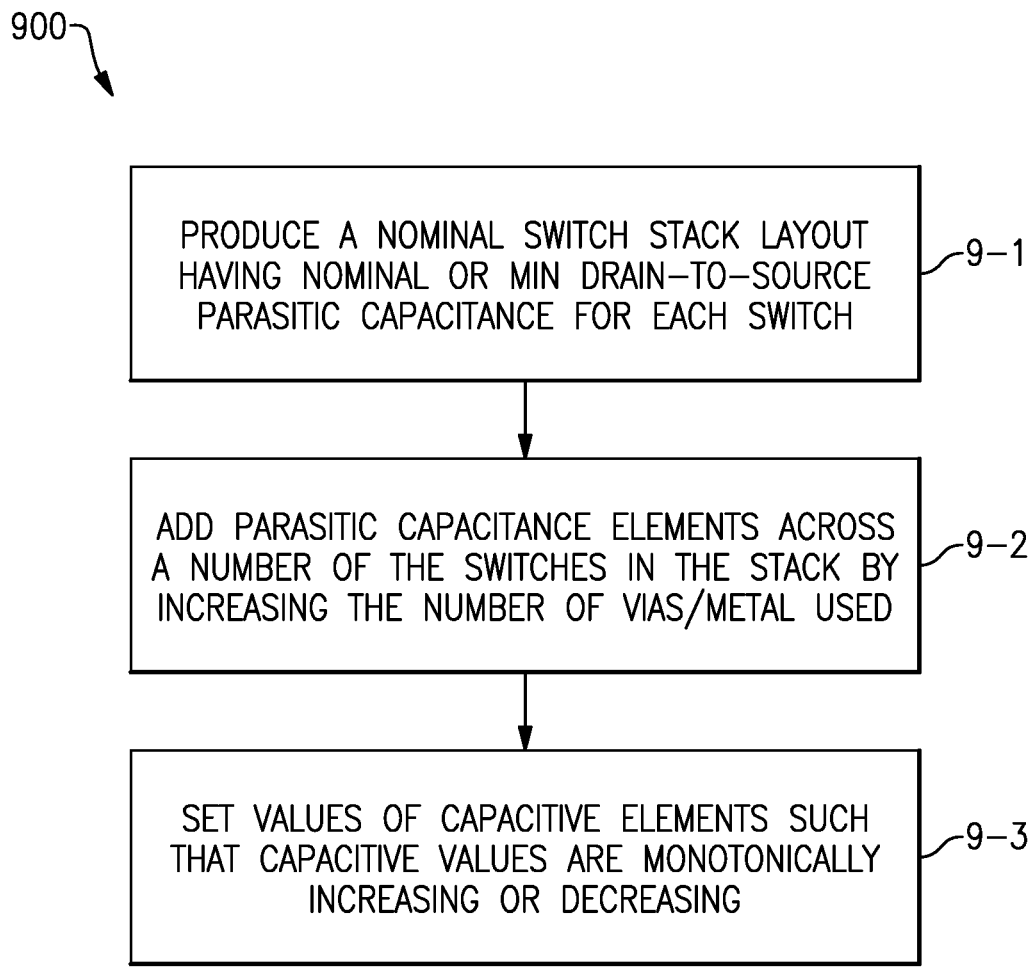
FIG. 9 is a flowchart of an implementation of a method of configuring a switch stack in order to improve voltage handling capability according to some implementations.

FIG. 9 is a flowchart representation of a method 900 of configuring a switch stack in order to improve voltage handling capability according to some. In some implementations, the method is performed during at least one of the manufacture of a switching element stack and the integration and/or packaging of the switching element stack with one or more other components. Briefly, the method 900 includes providing controlled amounts of lateral parasitic capacitance across one or more switches of a stack in order to produce a stack with graded lateral capacitance values.

To that end, as represented by block 9-1, the method 900 includes producing a nominal switch stack layout. In some implementations, producing a nominal switch stack layout includes configuring, using the layout rules and available materials of a particular semiconductor manufacturing process, at least one FET switch that can be arranged in a stack having the minimal amount of parasitic capacitance allowed using the particular semiconductor manufacturing process. As represented by block 9-2, the method 900 includes adding parasitic capacitive elements across one or more of the switches in the stack by increasing the number of vias or the amount of metal used. In some implementations, there are no more than n−1 capacitive elements, where n is the number of switches in the stack. As represented by block 9-3, the method 900 includes setting the values of the capacitive elements such that their capacitive values are monotonically increasing or decreasing across the stack. Consequently, in some implementations, the FET at one end of the stack does not have an associated capacitive element. In some implementations, at least some of the plurality of capacitive elements are formed with an excess of vias and metal available in a semiconductor manufacturing process. In some implementations, each of at least some of the plurality of capacitive elements provide a respective lateral capacitance between a drain and a source of a corresponding field effect transistor utilized as switching element.

Figure 10A:
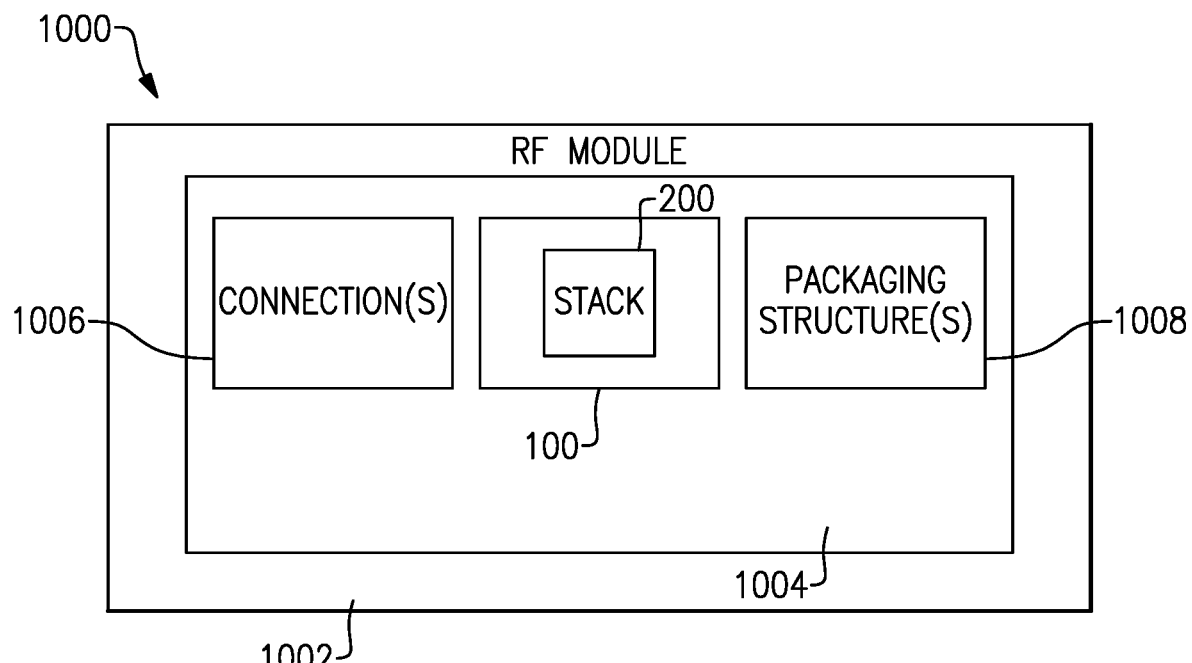
FIG. 10A is a first view of a schematic diagram of an implementation of an RF switch module according to some implementations.
Figure 10B:
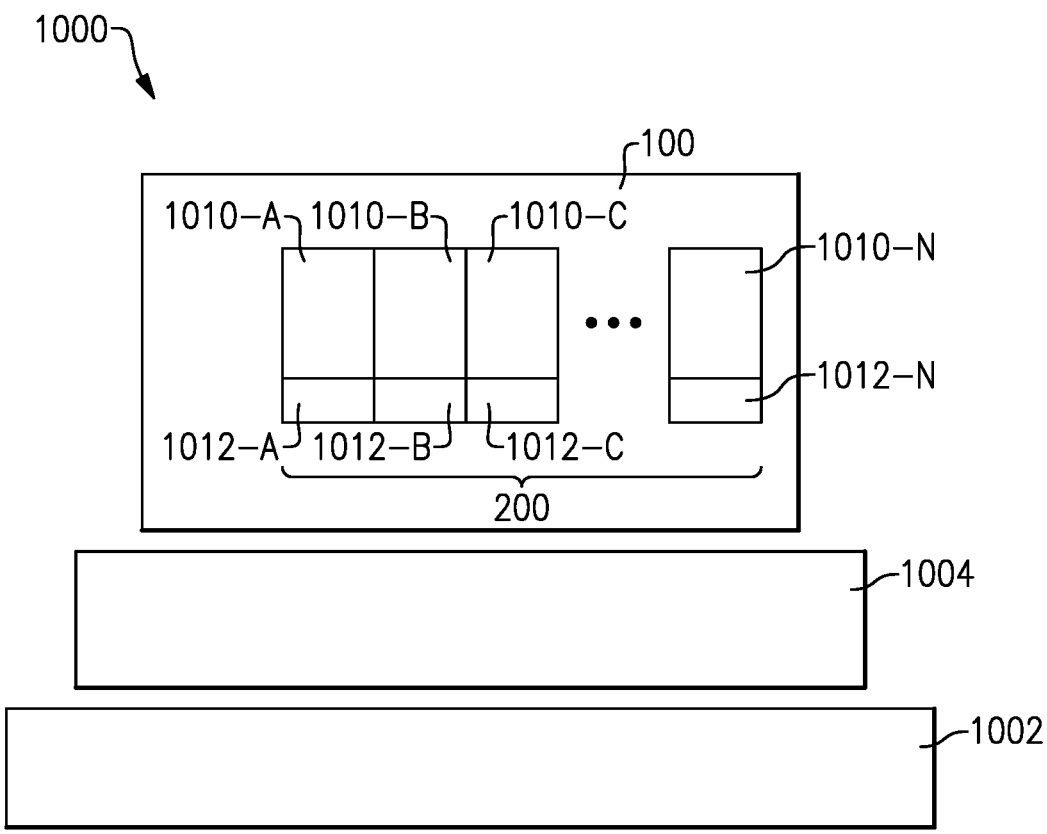
FIG. 10B is a second view of a schematic diagram of the implementation of the RF switch module in FIG. 10A.

FIG. 10A is a first view of a schematic diagram of an implementation of an RF switch module 1000 according to some implementations. While certain specific features are illustrated, those skilled in the art will appreciate from the present disclosure that various other features have not been illustrated for the sake of brevity and so as not to obscure more pertinent aspects of the example implementations disclosed herein. To that end, as shown in FIGS. 10A-10B, an RF switch 100 having one or more features described herein can be implemented in an RF switch module 1000. In some implementations, the RF switch 100 can include a stack 200 of switching elements (e.g., FETs) configured according one or more features as described herein.

In some implementations, the RF switch module 1000 can include a packaging substrate 1004 configured to receive a plurality of components. According to some implementations, a ground plane 1002 is arranged on a first side of the packaging substrate 1004. According to some implementations, the RF switch 100, one or more connections 1006, and one or more packaging structures are arranged on a second side of the packaging substrate 1004.

In some implementations, the one or more connections 1006 are configured to facilitate passage of signals and/or power to and from the RF switch 100. In some implementations, the one or more packaging structures 1008 provide functionality such as protection (e.g., physical, electromagnetic shielding, etc.) for the RF switch 100. In some implementations, the connections 1006 can include conductive paths such as bond wires to accommodate wirebond-implementation modules, and/or conductive traces to accommodate flipchip-implementation modules.

FIG. 10B is a second view of a schematic diagram of the implementation of the RF switch module 1000 in FIG. 10A. Elements common to FIGS. 10A and 10B include common reference numbers, and only the differences between FIGS. 10A and 10B are described herein for the sake of brevity. To that end, FIG. 10B illustrates the stack 200 with switching elements 1010-A, 1010-B, 1010-C, . . . , 1010-N (e.g., FETs) coupled in series. As shown in FIG. 10B, the stack 200 also includes a plurality of capacitive elements 1012-A, 1012-B, 1012-C, . . . , 1012-N, each of the plurality of capacitive elements 1012 provides a capacitive path across respective terminals of a corresponding one of the plurality of switching elements. For example, the capacitive element 1012-A provides a capacitive path across the terminal of the switching element 1010-A.

Figure 11:
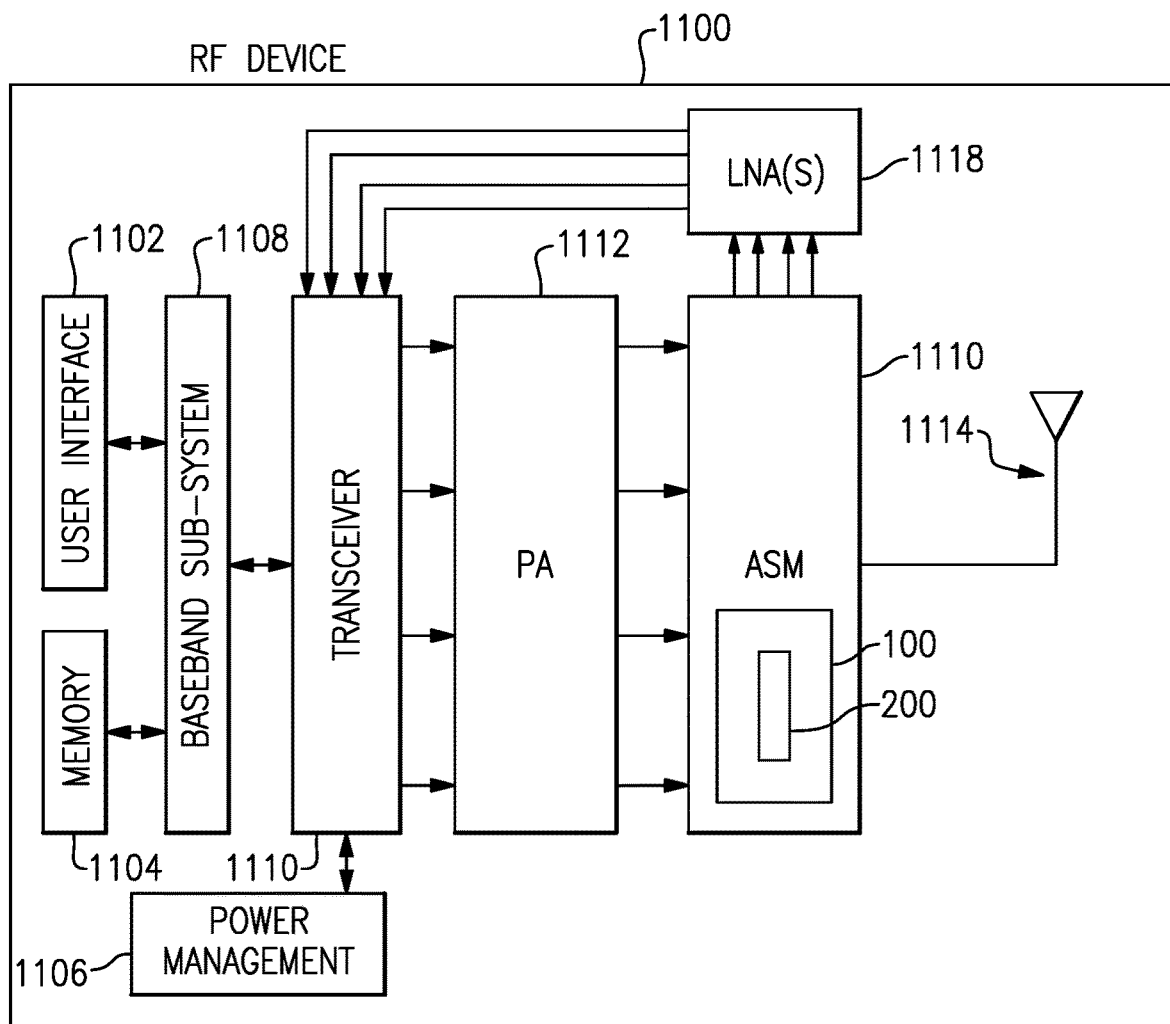
FIG. 11 is a schematic diagram of an implementation of an RF device according to some implementations.

FIG. 11 schematically depicts an example radio frequency (RF) device 1100 having one or more advantageous features described herein according to some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, in some implementations, the RF device 1100 is a wireless device. In some implementations, such a wireless device can include, for example, a cellular phone, a smart-phone, a hand-held wireless device with or without phone functionality, a wireless tablet, a wireless router, a wireless access point, a wireless base station, etc.

In some implementations the RF device 1100 includes one or more PAs in a PA module 1112 configured to receive their respective RF signals from a transceiver 1110 that can be configured and operated in known manners to generate RF signals to be amplified and transmitted, and to process received signals. The transceiver 1110 is shown to interact with a baseband sub-system 1108 that is configured to provide conversion between data and/or voice signals suitable for a user and RF signals suitable for the transceiver 1110. The transceiver 1110 is also shown to be connected to a power management component 1106 that is configured to manage power for the operation of the RF device 1100. Such power management can also control operations of the baseband sub-system 1108 and other components of the RF device 1100.

The baseband sub-system 1108 is shown to be connected to a user interface 1102 to facilitate various input and output of voice and/or data provided to and received from the user. The baseband sub-system 1108 can also be connected to a memory 1104 that is configured to store data and/or instructions to facilitate the operation of the wireless device, and/or to provide storage of information for the user.

In the example the RF device 1100, outputs of the PA module 1112 are optionally matched and routed to an antenna 1114 via antenna switch module (ASM) 1110. According to some implementations, the RF switch 100 including the stack 200 of switching elements (e.g., FETs) is implemented in ASM 1110. In some implementations, the RF switch 100 including the stack 200 is implemented in another component of the RF device 1100. In some implementations, the RF module 1000 of FIG. 10 is implemented in ASM 1110. In FIG. 11, received signals are shown to be routed through the ASM 1110 to one or more a low-noise amplifier (LNAs) 1118.

A number of other wireless device configurations can utilize one or more features described herein. For example, the RF device 1100 does not need to be a multi-band device. In another example, the RF device 1100 can include additional antennas such as diversity antenna, and additional connectivity features such as Wi-Fi, Bluetooth, and GPS.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware.

Computer software can comprise computer executable code stored in a computer readable medium (e.g., non-transitory computer readable medium) that, when executed, performs the functions described herein. In some implementations, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some implementations may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A wireless device comprising:
a transceiver;

an antenna in communication with the transceiver configured to transmit and receive radio-frequency signals; and a radio-frequency module including a radio-frequency switch, the radio-frequency switch including a ground plane, a stack arranged in relation to the ground plane, the stack including a plurality of switching elements coupled in series with one another, and a plurality of capacitive elements formed by a via density of a respective switching element, the via density of the respective switching element determined by a number of vias for the respective switching element, each of the plurality of capacitive elements having a respective capacitive value and providing a respective capacitive path across respective terminals of a corresponding one of the plurality of switching elements, the number of vias for each of the respective switching elements determined to set the via density of each of the respective switching elements such that the respective capacitive values of the plurality of capacitive elements provided by the via densities of the respective switching elements monotonically increase or decrease across the stack.

2. The wireless device of claim 1 wherein the plurality of switching elements includes field effect transistors, at least some of the field effect transistors being each coupled source-to-drain with one or more adjacent field effect transistors.

3. The wireless device of claim 1 wherein the plurality of switching elements includes one or more of: field effect transistors, bipolar junction transistors, GaAs transistors, diodes, or micro-electromechanical devices.

4. The wireless device of claim 1 wherein the ground plane includes at least a portion of a semiconductor substrate.

5. The wireless device of claim 1 wherein at least some of the plurality of capacitive elements are formed with an excess of vias and metal available in a semiconductor manufacturing process.

6. The wireless device of claim 1 wherein each of at least some of the plurality of capacitive elements provides a respective lateral capacitance between a drain and a source of a corresponding field effect transistor utilized as a switching element.

7. The wireless device of claim 1 wherein the plurality of switching elements includes N switching elements and the plurality of capacitive elements includes N-1 capacitive elements.

8. The wireless device of claim 1 wherein the wireless device includes one or more of: a base station, a repeater, a cellular phone, a smartphone, a computer, a laptop, a tablet computer, or a peripheral device.

9. A wireless device comprising:
a transceiver;
an antenna in communication with the transceiver configured to transmit and receive radio-frequency signals; and an antenna switch module including a radio-frequency switch, the radio-frequency switch including a ground plane, a stack arranged in relation to the ground plane, the stack including a plurality of switching elements coupled in series with one another, and a plurality of capacitive elements formed by a via density of a respective switching element, the via density of the respective switching element determined by a number of vias for the respective switching element, each of the plurality of capacitive elements having a respective capacitive value and providing a respective capacitive path across respective terminals of a corresponding one of the plurality of switching elements, the number of vias for each of the respective switching elements determined to set the via density of each of the respective switching elements such that the respective capacitive values of the plurality of capacitive elements provided by the via densities of the respective switching elements monotonically increase or decrease across the stack.

10. The wireless device of claim 9 wherein the plurality of switching elements includes field effect transistors, at least some of the field effect transistors being each coupled source-to-drain with one or more adjacent field effect transistors.

11. The wireless device of claim 9 wherein the plurality of switching elements includes one or more of: field effect transistors, bipolar junction transistors, GaAs transistors, diodes, or micro-electromechanical devices.

12. The wireless device of claim 9 wherein the ground plane includes at least a portion of a semiconductor substrate.

13. The wireless device of claim 9 wherein at least some of the plurality of capacitive elements are formed with an excess of vias and metal available in a semiconductor manufacturing process.

14. The wireless device of claim 9 wherein each of at least some of the plurality of capacitive elements provides a respective lateral capacitance between a drain and a source of a corresponding field effect transistor utilized as a switching element.

15. The wireless device of claim 9 wherein the plurality of switching elements includes N switching elements and the plurality of capacitive elements includes N-1 capacitive elements.

16. The wireless device of claim 9 wherein the wireless device includes one or more of: a base station, a repeater, a cellular phone, a smartphone, a computer, a laptop, a tablet computer, or a peripheral device.

* * * * *